(12) United States Patent
Di Cioccio et al.

(10) Patent No.: US 9,064,863 B2
(45) Date of Patent: Jun. 23, 2015

(54) METHOD FOR DIRECTLY ADHERING TWO PLATES TOGETHER, INCLUDING A STEP OF FORMING A TEMPORARY PROTECTIVE NITROGEN

(75) Inventors: Léa Di Cioccio, Saint Ismier (FR); Laurent Vandroux, Le Cheylas (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 291 days.

(21) Appl. No.: 13/818,843

(22) PCT Filed: Aug. 31, 2011

(86) PCT No.: PCT/FR2011/000483
§ 371 (c)(1),
(2), (4) Date: May 6, 2013

(87) PCT Pub. No.: WO2012/028792
PCT Pub. Date: Mar. 8, 2012

(65) Prior Publication Data
US 2013/0217207 A1    Aug. 22, 2013

(30) Foreign Application Priority Data
Aug. 31, 2010   (FR) ...................................... 10 03495

(51) Int. Cl.
*H01L 21/30* (2006.01)
*H01L 21/50* (2006.01)
*H01L 21/02* (2006.01)
*H01L 21/20* (2006.01)
*H01L 21/762* (2006.01)

(52) U.S. Cl.
CPC .......... *H01L 21/50* (2013.01); *H01L 21/02332* (2013.01); *H01L 21/0234* (2013.01); *H01L 21/2007* (2013.01); *H01L 21/76251* (2013.01)

(58) Field of Classification Search
CPC ...................... H01L 21/02332; H01L 21/0234; H01L 21/50; H01L 21/7625; H01L 21/2007
See application file for complete search history.

(56) References Cited

U.S. PATENT DOCUMENTS

| 7,736,993 B2 | 6/2010 | Allibert et al. |
| 7,977,747 B2 | 7/2011 | Allibert et al. |
| 2007/0170503 A1 | 7/2007 | Allibert et al. |

(Continued)

FOREIGN PATENT DOCUMENTS

EP    1 811 561 A1    7/2007

OTHER PUBLICATIONS

Mar. 4, 2013 International Preliminary Report on Patentability issued in International Application No. PCT/FR2011/000483.

*Primary Examiner* — Alonzo Chambliss
(74) *Attorney, Agent, or Firm* — Oliff PLC

(57) ABSTRACT

To avoid problems of hydrolysis of the silicon oxide formed by PECVD at the surface of at least one wafer, it is proposed to cover, in the vacuum deposition chamber used to deposit the silicon oxide, said oxide with a temporary protective layer containing nitrogen. The protective layer thus protects the silicon oxide against the outer environment and especially against humidity when the wafer provided with the silicon oxide is stored outside of the vacuum deposition chamber. Afterwards, the protective layer is removed, for example, by chemical-mechanical polishing, just before the two wafers are placed into contact. The protective layer may be formed by a PECVD silicon nitride deposition, by plasma nitriding or nitrogen doping of a superficial portion of the silicon oxide.

8 Claims, 2 Drawing Sheets

(56) References Cited

U.S. PATENT DOCUMENTS

| | | |
|---|---|---|
| 2009/0111244 A1 | 4/2009 | Yamazaki et al. |
| 2009/0170286 A1* | 7/2009 | Tsukamoto et al. .......... 438/458 |
| 2009/0239354 A1 | 9/2009 | Suzawa et al. |
| 2010/0087047 A1* | 4/2010 | Shimomura et al. .......... 438/459 |
| 2010/0148322 A1 | 6/2010 | Allibert et al. |
| 2011/0097871 A1* | 4/2011 | Neyret et al. ................. 438/458 |

* cited by examiner

METHOD FOR DIRECTLY ADHERING TWO PLATES TOGETHER, INCLUDING A STEP OF FORMING A TEMPORARY PROTECTIVE NITROGEN

BACKGROUND OF THE INVENTION

The present invention relates to a method for directly bonding two plates together, comprising, before the plates are placed into contact, a step of forming a silicon oxide by plasma-enhanced chemical vapor deposition at the surface of at least one plate previously placed in a vacuum deposition chamber.

STATE OF THE ART

Molecular bonding or direct bonding is based on the placing of two surfaces in direct contact, without using a specific material such as glue, wax, and a metal of low melting temperature. The surfaces intended to be placed into contact may be hydrophilic or hydrophobic.

A hydrophobic surface may for example be an exposed surface of a silicon wafer (or substrate) free of silicon oxide while a hydrophilic surface may for example be an exposed surface of a silicon wafer comprising a thin silicon oxide layer.

The molecular bonding method further requires that the surfaces intended to be bonded are sufficiently smooth, free of particles or of contamination, and that they have an adapted surface chemistry and are sufficiently close to each other to initiate a contact. In this case, attractive forces between the two surfaces are strong enough to cause the molecular bonding.

Bondings are generally performed at ambient temperature and at ambient pressure, after a chemical cleaning of the surfaces. However, a subsequent thermal treatment, for example, at a temperature on the order of 1,000° C., is often performed to reinforce bonding energies. Now, in a very large number of applications, the steps of thermal treatment at such a temperature are not allowed.

Bonding methods which require no thermal treatments at such a high temperature after the placing into contact of the surfaces to be bonded have already been provided. They generally comprise a surface activation step prior to the placing into contact, which enables to limit the bonding consolidation thermal treatment between 200 and 400° C.

When the bonding process involves at least one surface provided with silicon oxide deposited by plasma-enhanced chemical vapor deposition (PECVD), this oxide tends to hydrolyze before said surface is placed into contact with another surface and, in particular, during the storage period. Now, the presence of water at the surface leads to a deterioration of the properties of silicon oxide and generates defects at the bonding interface, when the surfaces are bonded.

To overcome this problem of hydrolysis of the silicon oxide deposited by PECVD, one or several anneals are generally performed before the bonding, to increase the density of the oxides deposited by PECVD. However, in the same way as for the thermal treatment carried out after the placing into contact to reinforce bonding energies, the fact of exposing certain surfaces to a high temperature (generally of the same order of magnitude as that allowed for the subsequent thermal treatment) may be prejudicial for devices having a limited thermal budget.

SUMMARY OF THE INVENTION

The object of the present invention is to provide a method for direct bonding of two wafers together, overcoming the disadvantages of prior art, especially in the case of silicon oxide deposited by PECVD on at least one wafer. More specifically, the object of the present invention is to provide an alternative to the annealing treatment performed in prior art before placing the wafers into contact, to keep a good quality of PECVD-deposited silicon oxide until the placing into contact.

According to the present invention, this aim is achieved by a method for direct bonding of two wafers together comprising, before the wafers are placed into contact, a step of forming a silicon oxide by plasma-enhanced chemical vapor deposition at the surface of at least one wafer previously placed in a vacuum deposition chamber, characterized in that:

the silicon oxide formed at the surface of said wafer is covered with a protective layer comprising nitrogen before said wafer has come out of the vacuum deposition chamber, and the placing into contact of the two wafers is preceded by a step of removal of the protective layer.

According to a development of the present invention, the protective layer may be formed:

by plasma-enhanced chemical vapor deposition of silicon nitride on the silicon oxide, by plasma-enhanced nitriding of a superficial portion of the silicon oxide, or by doping with nitrogen a superficial portion of the silicon oxide.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
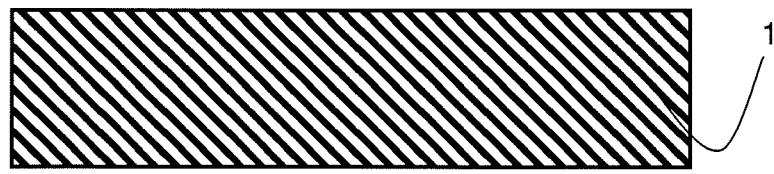
FIGS. 1 to 5 schematically illustrate in cross-section view different steps of a particular embodiment of direct bonding of two wafers together.

To avoid problems of hydrolysis of the silicon oxide formed by PECVD at the surface of at least one wafer advantageously made of a semiconductor material, such as a silicon wafer, it is proposed to cover the silicon oxide with a protective layer comprising nitrogen.

Further, this step of covering the silicon oxide with the protective layer is performed in situ, that is, in the vacuum deposition chamber used for the silicon oxide PECVD. Thus, the wafer provided with the PECVD-deposited silicon oxide is only taken out of the chamber once the silicon oxide has been deposited and covered with the protective layer. In particular, the portion covered with the protective layer corresponds at least to the exposed silicon oxide surface intended to be placed into contact with another surface to provide the wafer bonding.

The protective layer comprising nitrogen thus protects the silicon oxide against the outer environment and especially against the humidity present in the atmosphere when the wafer is stored outside of the vacuum deposition chamber. This storage phase may last for several days before the wafer can be used to be bonded to another wafer.

Finally, the protective layer is a temporary protective layer: it is removed just before the plate is placed into contact with another plate for the direct bonding. It is for example removed by a step of chemical-mechanical polishing (CMP). This CMP step is also used to activate the silicon oxide surface before the bonding by increasing its roughness. In certain cases, when it is not necessary to activate the surface to be placed into contact for the bonding, the protective layer may also be removed by a simple etching operation.

The protective layer comprising nitrogen is in the vacuum deposition chamber used for the silicon oxide PECVD process. It may be obtained by various techniques. In particular, it is formed:
- by plasma-enhanced chemical vapor deposition of silicon nitride on the silicon oxide,
- by plasma-enhanced nitriding of a superficial portion of the silicon oxide, or
- by doping with nitrogen a superficial portion of the silicon oxide.

In the case of a silicon nitride PECVD process, the thickness of the protective layer advantageously ranges between 2 nm and a few hundreds of nanometers and advantageously ranges between 10 nm and 100 nm. As an example, a SiN protective layer has been formed by PECVD after the silicon oxide PECVD process at a 400° C. temperature. Such a silicon nitride has a density on the order of 2.4.

The conditions enabling to perform a plasma-enhanced nitriding (or plasma nitriding) to form the protective layer comprising nitrogen are especially the following:
- duration ranging between 10 s and 300 s,
- temperature equivalent to that of the silicon oxide PECVD process,
- RF power source: 50-1,000 W,
- active gas comprising nitrogen: $NH_3$ and/or $N_2$ with a flow rate capable of varying up to 5,000 sccm.
- possible carrier gases: Ar and/or He with a flow rate varying from 0 to 5,000 sccm.

The nitrogen doping performed at the end of the silicon oxide PECVD process to form the protective layer comprising nitrogen is for example obtained by adding $N_2$ and/or $NH_3$ to the deposition gases used to form the silicon oxide, with a power adjustment to keep the adequate mechanical properties. The $N_2$ gas flow rate ranges between 0 and 5,000 sccm while that of the $NH_3$ gas ranges between 0 and 1,000 sccm.

Figure 2:
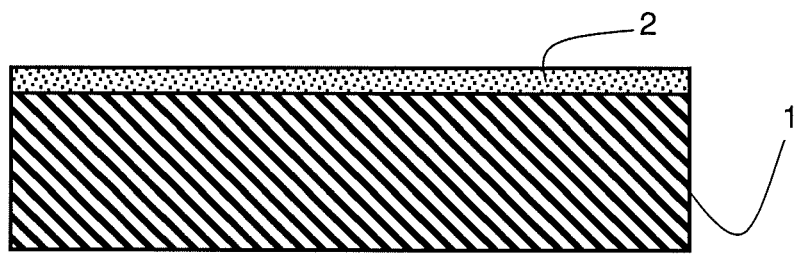
Figure 3:
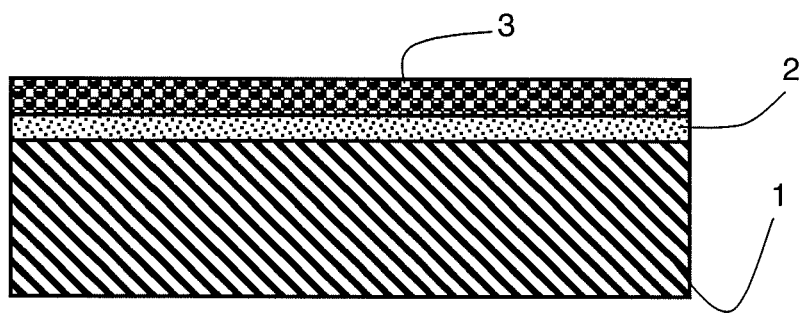
Figure 4:
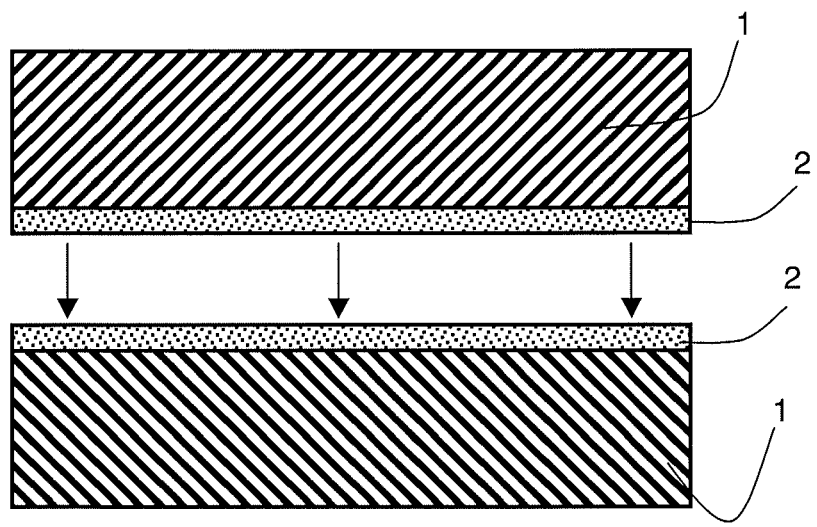
Figure 5:
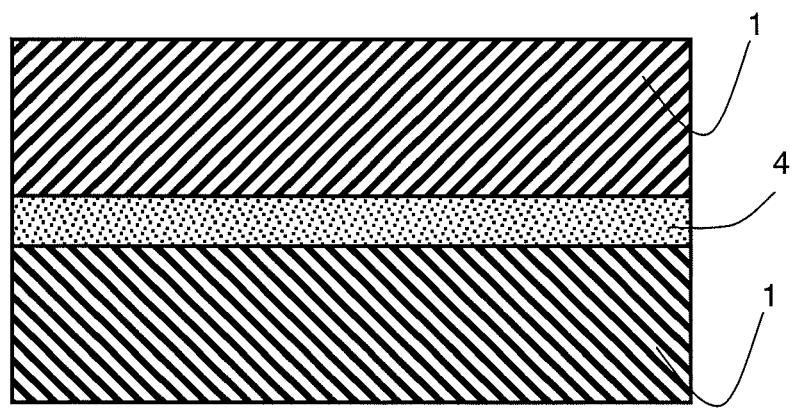

According to a specific embodiment shown in FIGS. 1 to 5, two silicon substrates 1 are bonded together by successively carrying out:
- a step of forming a silicon oxide 2 by PECVD, at the surface of each of the two substrates 1 placed in a same vacuum deposition chamber (FIGS. 1 and 2),
- a step of forming, within the same vacuum deposition chamber, protective layer 3 comprising nitrogen on silicon oxide 2 covering each substrate 1 (FIG. 3),
- a step of extraction of substrates 1 out of the vacuum deposition chamber, to store them in an unprotected environment (containing water) before they are placed into contact,
- a step of removal of protective layer 3 from each substrate 1 to expose the silicon oxide surfaces intended to be placed into contact,
- a step of placing into contact the two substrates (FIGS. 4 and 5) by bringing the exposed silicon oxide surfaces of the two substrates 1 towards each other until a molecular bonding is obtained and a bonding interface 4 is created between the two substrates 1.

The storage of substrates 1 may last for from a few minutes to a few days, before substrates 1 are bonded together. During this storage time, they are protected by protective layer 3 from the water present in the outer environment. However, when the step of placing into contact is desired to be carried out, protective layers 3 are removed just before this step of placing into contact. This step may for example be carried out by a chemical-mechanical polishing (CMP) or by simple etching, in which case this step may also be used to activate the surfaces for the bonding, and no other treatment is performed on substrates 1 between the removal of protective layer 3 and the placing into contact. A specific activation step may however be provided before the placing into contact. The time elapsed between the removal of the protective layer and the placing into contact must be sufficiently short to preserve the surface activation necessary to the bonding. This time period between the two steps more specifically corresponds to the handling time necessary to have the plates transferred from the removal step to the step of placing into contact. As an example, this time period may approximately be estimated to a few minutes.

In the embodiment shown in FIGS. 1 to 5, the two substrates 1 intended to be bonded together are placed in a vacuum deposition chamber. It may be the same deposition chamber or two different deposition chambers, to successively form the silicon oxide and its protective layer. When the two substrates 1 are placed in a same vacuum deposition chamber, the silicon oxides may be simultaneously formed on the two substrates, as well as the protective layers.

According to a variation, the silicon oxide may be deposited on a single one of the two substrates to be bonded to perform, for example, a mixed bonding (hydrophilic surface/hydrophobic surface). In this case, only the concerned substrate is arranged in the vacuum deposition chamber for the silicon oxide PECVD process and the forming of the protective layer. The other substrate is then activated at its surface according to conventional techniques. It is for example submitted to a chemical-mechanical polishing operation followed by an operation of treatment with a reducing plasma (for example, containing nitrogen) before being placed into contact with the first substrate.

The fact of protecting the silicon oxide against humidity during the wafer storage, via a protective layer comprising nitrogen, enables to obtain, at the placing into contact, a non-aged or unaltered silicon oxide, and the bonding energy then corresponds to that of the initially-deposited silicon oxide, even when the storage is very long. Further, such a solution is adapted to applications requiring a low thermal budget.

The invention claimed is:

1. A method for direct bonding of first and second wafers, comprising successively:
   - forming at the surface of the first wafer, a first silicon oxide layer by plasma enhanced chemical vapor deposition in situ, in a vacuum deposition chamber;
   - forming on the first silicon oxide layer a first protective layer comprising nitrogen in the vacuum deposition chamber before the first wafer has exiting the vacuum deposition chamber;
   - stocking up the first wafer out of the vacuum deposition chamber;
   - freeing the first silicon oxide layer by removing the first protective layer;
   - contacting the first silicon oxide layer with the surface of the second wafer for direct bonding the two wafers together at an interface between the first silicon oxide layer and the second wafer.

2. The method of claim 1, wherein the first protective layer is formed by plasma-enhanced chemical vapor deposition of silicon nitride on the first silicon oxide layer.

3. The method of claim 1, wherein the first protective layer is formed by plasma-enhanced nitriding of a superficial portion of the first silicon oxide layer.

4. The method of claim 1, wherein the first protective layer is formed by doping with nitrogen a superficial portion of the first silicon oxide layer.

5. The method of claim 1, wherein the first protective layer is removed by chemical-mechanical polishing.

6. The method of claim 1, wherein the first protective layer is removed by etching.

7. The method of claim 1, comprising successively:
- forming at the surface of the second wafer, a second silicon oxide layer by plasma enhanced chemical vapor deposition in situ in a vacuum deposition chamber;
- forming on the second silicon oxide layer a second protective layer comprising nitrogen in the same vacuum deposition chamber where the second silicon oxide layer was formed, before the second wafer has exiting the vacuum deposition chamber;
- stocking up the second wafer out of the vacuum deposition chamber;
- freeing the second silicon oxide layer by removing the second protective layer;
- contacting the second silicon oxide layer with the first silicon oxide layer for direct bonding the two wafers together.

8. The method of claim 1, wherein the second wafer is submitted, before the contacting step, to a chemical-mechanical polishing operation followed by an operation of treatment with a silicon oxide reducing plasma.

\* \* \* \* \*

UNITED STATES PATENT AND TRADEMARK OFFICE
CERTIFICATE OF CORRECTION

| | | |
|---|---|---|
| PATENT NO. | : 9,064,863 B2 | Page 1 of 1 |
| APPLICATION NO. | : 13/818843 | |
| DATED | : June 23, 2015 | |
| INVENTOR(S) | : Lea Di Cioccio et al. | |

It is certified that error appears in the above-identified patent and that said Letters Patent is hereby corrected as shown below:

Title Page:

In the Title (54), delete "METHOD FOR DIRECTLY ADHERING TWO PLATES TOGETHER, INCLUDING A STEP OF FORMING A TEMPORARY PROTECTIVE NITROGEN" and insert --METHOD FOR DIRECTLY ADHERING TWO PLATES TOGETHER, INCLUDING A STEP OF FORMING A TEMPORARY PROTECTIVE NITROGEN LAYER--, therefor.

Signed and Sealed this
Third Day of November, 2015

Michelle K. Lee
*Director of the United States Patent and Trademark Office*